United States Patent
Derksen et al.

(10) Patent No.: US 11,742,834 B2
(45) Date of Patent: Aug. 29, 2023

(54) LOW POWER FREE RUNNING OSCILLATOR

(71) Applicant: NXP B.V., Eindhoven (NL)

(72) Inventors: Sander Derksen, Hank (NL); Jos Verlinden, Wachtendonk (DE); Ids Christiaan Keekstra, Drenthe (NL); René Verlinden, Geldern (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/931,867

(22) Filed: Sep. 13, 2022

(65) Prior Publication Data

US 2023/0006655 A1 Jan. 5, 2023

Related U.S. Application Data

(62) Division of application No. 17/362,353, filed on Jun. 29, 2021, now Pat. No. 11,476,838.

(51) Int. Cl.
*H03K 3/0231* (2006.01)
*H03K 3/011* (2006.01)

(52) U.S. Cl.
CPC .......... *H03K 3/011* (2013.01); *H03K 3/0231* (2013.01)

(58) Field of Classification Search
CPC .. H03B 25/00; H03B 2200/009; H03K 3/011; H03K 3/023; H03K 3/0231; H03K 5/2481; H03K 5/249; H03L 7/097
See application file for complete search history.

(56) References Cited

U.S. PATENT DOCUMENTS

| | | | |
|---|---|---|---|
| 6,353,368 B1* | 3/2002 | Iravani | H03B 5/04 331/25 |
| 6,727,768 B1* | 4/2004 | Dasgupta | H03K 3/0231 331/177 R |
| 10,250,269 B2* | 4/2019 | Verlinden | H03K 3/0315 |
| 2002/0041217 A1* | 4/2002 | Crofts | H03K 4/023 331/175 |
| 2011/0156760 A1* | 6/2011 | Bhuiyan | H03K 17/162 331/16 |
| 2012/0161868 A1* | 6/2012 | Yayama | H03L 1/00 330/252 |
| 2017/0214392 A1* | 7/2017 | Lee | H03K 3/012 |
| 2017/0257103 A1* | 9/2017 | Nishida | H03L 7/08 |
| 2018/0351509 A1* | 12/2018 | Zhang | H03B 5/1231 |

\* cited by examiner

*Primary Examiner* — Levi Gannon

(57) ABSTRACT

Various embodiments relate to a free running oscillator, that includes a switch capacitor based frequency-to-voltage converter (F2V), a comparator, and a voltage controlled oscillator (VCO), which may be collectively configured to reduce amplifier offset and flicker noise while increasing effective gain of the amplifier of the comparator. The F2V may produce a feedback voltage Vfb corresponding to frequencies of output of the VCO. The comparator may be configured to sample a reference voltage Vref using a sampling capacitor, compare Vref to Vfb, and generate an output based on any difference between Vref and Vfb, where the output may be integrated using an integrating capacitor of the comparator. The comparator may compensate for parasitic capacitance at the output of the amplifier by using an amplifier having two outputs, with the sampling capacitor and integrating capacitor being coupled to respectively different outputs of the amplifier.

14 Claims, 5 Drawing Sheets

LOW POWER FREE RUNNING OSCILLATOR

CROSS-REFERENCE TO RELATED APPLICATIONS

This application is a divisional claiming benefit of the filing date of prior U.S. patent application Ser. No. 17/362,353, filed Jun. 29, 2021, the contents of which are incorporated by reference herein.

TECHNICAL FIELD

Various exemplary embodiments disclosed herein relate generally to low power free running oscillator (FRO) combining low phase noise with high frequency stability.

BACKGROUND

Low power silicon-based FROs with high frequency accuracy and low phase noise are indispensable for many products. Especially for low power wireless systems (IoT, BLE, key fobs) energy is often scarce because it is delivered by batteries or even by energy harvesting.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a free running oscillator, including: a voltage controlled oscillator circuit including an input configured to receive an input voltage and an output configured to provide an oscillation signal, wherein the input voltage controls a frequency of the oscillation signal; a frequency to voltage circuit including an input configured to receive the oscillation signal and an output configured to produce a voltage dependent on a frequency of the oscillation signal; a comparison circuit including an input and an output including: a first amplifier including a first input, a second input, and an output, wherein the output is based upon a difference in voltage between the first input and the second input, wherein the first input received one of a reference voltage and the output of frequency to voltage circuit; a second amplifier including a first input, a second input, and an output, wherein the output is based upon a difference in voltage between the first input and the second input, first input is connected to the comparator output, the second inputs is connected to the second amplifier output; a sampling capacitor connected between the second input of the first amplifier and a ground; and an integration capacitor connected between the comparator output and the ground.

Various embodiments are described, wherein a first switch with an output connected to the first input of the amplifier and a first input connected to the reference voltage and a second input connected to the output of frequency to voltage circuit, wherein the first switch switches between the first input and the second input to produce an output signal at the first switch output; a second switch connected between the amplifier output and the comparator output; a third switch connected between the output of the first amplifier and the second input of the first amplifier; and a fourth switch connected between the output of the second amplifier and the output of the first amplifier.

Various embodiments are described, wherein the voltage controlled oscillator circuit produces a first phase signal, a second phase signal, and a third phase signal, the first phase signal controls the first switch and the third switch between a sampling phase and comparison phase, the second phase signal controls the fourth switch during the comparison phase to charge a parasitic capacitance at the output of the first amplifier, and the third phase signal controls second switch during the comparison phase to connect the output of the first amplifier to the output of the comparator.

Various embodiments are described, wherein second phase signal activates the fourth switch during a timeframe different from the timeframe when the third phase signal controls the second switch.

Various embodiments are described, wherein the sampling phase includes sampling the reference voltage and storing the sampled reference voltage on the sampling capacitor.

Various embodiments are described, wherein the comparison phase includes comparing a voltage on the sampling capacitor with the output of the frequency to voltage circuit.

Various embodiments are described, wherein the first amplifier is an operational amplifier wherein the output is a current based upon the difference in voltage between the first input and second input of the first amplifier.

Various embodiments are described, wherein the second amplifier is an operational amplifier wherein the output is a current based upon the difference in voltage between the first input and second input of the second amplifier.

Further various embodiments relate to a free running oscillator, including: a voltage controlled oscillator circuit including an input configured to receive an input voltage and an output configured to provide an oscillation signal, wherein the input voltage controls a frequency of the oscillation signal; a frequency to voltage circuit including an input configured to receive the oscillation signal and an output configured to produce a voltage dependent on a frequency of the oscillation signal; a comparison circuit including an input and an output including: an amplifier including a first input, a second input, a first output, a second output, and a first switch, wherein the first and second output is based upon a difference in voltage between the first input and the second input, the first switch activates one of the first output and the second output, and the second output is connected to the second input; a second switch with an output connected to the first input of the amplifier and a first input connected to a reference voltage and a second input connected to the output of frequency to voltage circuit, wherein the second switch switches between the first input and the second input to produce an output signal at the second switch output; a sampling capacitor connected between the second input of the first amplifier and a ground; and an integration capacitor connected between the first comparator output and the ground.

Various embodiments are described, wherein the voltage controlled oscillator circuit produces a control signal configured to control the first switch and second switch.

Various embodiments are described, wherein a sampling phase includes sampling the reference voltage and storing the sampled reference voltage on the sampling capacitor based upon the control signal.

Various embodiments are described, wherein a comparison phase includes comparing a voltage on the sampling capacitor with the output of the frequency to voltage circuit based upon the control signal.

Various embodiments are described, wherein the amplifier is an operational amplifier wherein the output is a current based upon the difference in voltage between the first input and second input of the first amplifier.

Further various embodiments relate to a method for operating a free running oscillator system, the method including operating the oscillator system during a plurality of phases of a comparison circuit of the oscillator system occurring periodically, including: during a first phase of the plurality of phases, providing a reference voltage to a first input of a first amplifier via a first switch, wherein a second input of the first amplifier is coupled via a first switch to an output of the first amplifier and is coupled to a sampling capacitor, wherein a voltage of the output of the first amplifier is provided to the sampling capacitor; during a second phase and a third phase of the plurality of phases, providing an output voltage from a frequency to voltage circuit to the second input, during the second phase providing a voltage from an integration capacitor to a first input of a second amplifier, wherein the output of the second amplifier is attached to the second input of the second amplifier and the output of the second amplifier is applied to the output of the first amplifier via a third switch to charge a parasitic capacitance at the output of the first amplifier; during the third phase providing the voltage of the output of the first amplifier via a fourth switch to a voltage controlled oscillator circuit for controlling a frequency of an oscillation signal outputted by the voltage controlled oscillator circuit, wherein during the second phase and the third phase, the sampling capacitor is coupled to the second input of the first amplifier, the first switch is open, and the voltage of the output of the first amplifier is not provided to the sampling capacitor; wherein the oscillation signal is provided to the frequency to voltage circuit and the output voltage of the frequency to voltage circuit is dependent on the frequency of the oscillation signal.

Various embodiments are described, further including producing a first phase signal, a second phase signal, and a third phase signal by the voltage controlled oscillator circuit, wherein the first phase signal controls the first switch and the second switch, the second phase signal controls the third switch, and the third phase signal controls the fourth switch.

Further various embodiments relate to a method for operating a free running oscillator system, the method including operating the oscillator system during a plurality of phases of a comparison circuit of the oscillator system occurring periodically, including: during a first phase of the plurality of phases, providing a reference voltage to a first input of an amplifier via a first switch, wherein a second input of the first amplifier is coupled to a first output of the amplifier and is coupled to a sampling capacitor, wherein a voltage of the first output of the amplifier is provided to the sampling capacitor; during a second phase of the plurality of phases, providing an output voltage from a frequency to voltage circuit to the first input via the first switch, providing the voltage of a second output of the amplifier to a voltage controlled oscillator circuit for controlling a frequency of an oscillation signal outputted by the voltage controlled oscillator circuit, wherein the amplifier produces an output at the first output during a first phase, and wherein the amplifier produces an output at the second output during a second phase.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Silicon-based FROs combine low phase noise with high accuracy. The high accuracy is achieved by a switched-cap feedback loop with novel auto-zeroing solution for offset compensation whereas the low phase noise is achieved using a voltage-controlled oscillator. The FRO has a best-in-class power supply rejection and can also operate at low supply voltages.

With the new embodiments described herein, the frequency accuracy of the prior art feedback FRO solution is even further improved. The embodiments described herein are a further improvement of prior art solution found in U.S. Pat. No. 10,250,269, which is hereby incorporated by reference for all purposes as if fully set forth herein. The embodiments described herein include the following features: low phase noise (high figure of merit); high frequency stability over process and voltage; high accuracy; low Allan deviation; high power supply rejection; linear tuning range; and small area. The FRO solution illustrated by the embodiments described herein will decrease the cost of current products by: reduced trim costs; single trim at any temperature; possible replacement of X-tal; reducing bill of materials; smaller form factor; and increased reliability by eliminating a (mechanically sensitive) X-tal.

Figure 1:
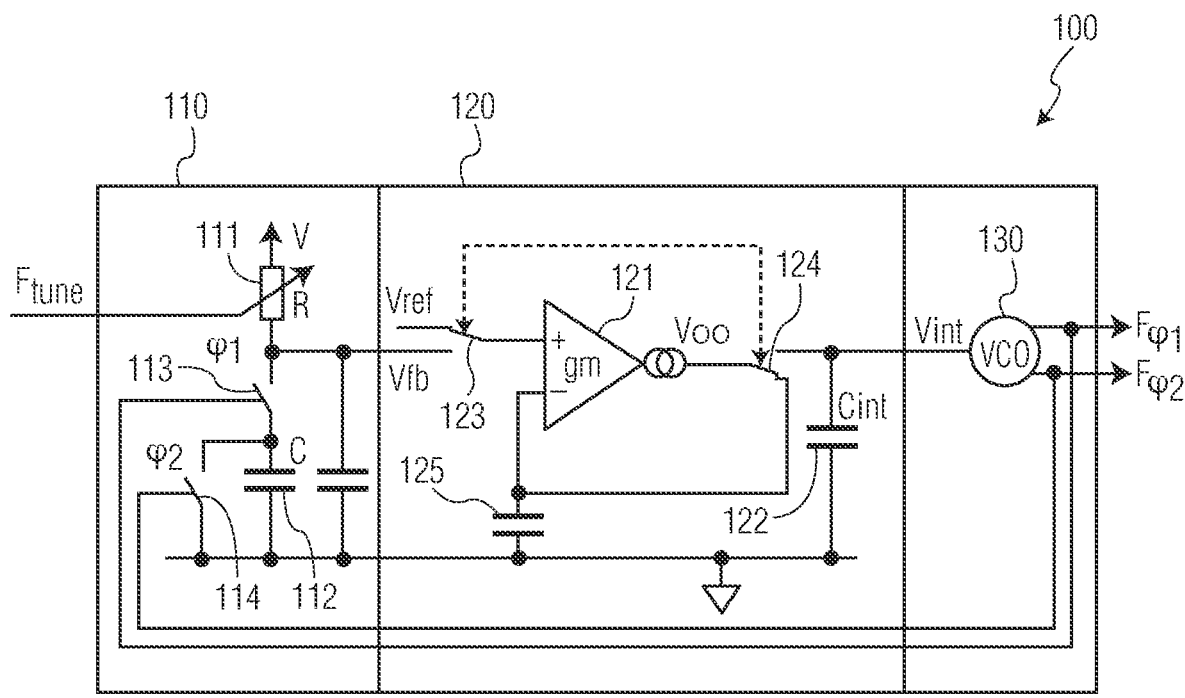
FIG. 1 illustrates the prior art solution.

FIG. 1 illustrates the prior art solution as found in U.S. Pat. No. 10,250,269. The prior art FRO 100 is a ring oscillator with a switched-cap based feedback loop. The offset of the amplifier is removed by means of auto-zeroing. The auto-zeroing solution removes the offset and flicker noise and increases the effective gain which results in an increased accuracy and higher frequency stability. The FRO 100 includes a switched capacitor based frequency to voltage converter (F2V) 110, a comparator 120, and the voltage controlled oscillator (VCO) 130. The VCO 130 outputs two frequencies that are fed back to the F2V 110 which are used to control two switches 113 and 114. A switch capacitor 112 is used with a variable resistor 111 to control the output of the F2V 110. The switch capacitor 112 looks like a resistor based upon the frequency of the signal across it. The switch capacitor 112 and the variable resistor 111 act as a voltage divider to produce a feedback voltage Vfb.

The comparator 120 may act as an integrator. The comparator 120 includes an amplifier 121, switches 123 and 124, an integration capacitor 122, and a sampling capacitor 125. The amplifier 121 may be an operational transconductance amplifier (OTA) or other type of appropriate amplifier. The amplifier 121 converts a voltage difference at the inputs to an output current. When the FRO is at the correct frequency, the output of the amplifier 121 is zero current. The switches 123 and 124 are switched so that a reference voltage Vref is applied to the input of the amplifier 120 which charges the sampling capacitor 125 until it reaches a voltage of Vref. Then the switches 123 and 124 are switched so that Vfb is input to the amplifier 121, and the output current of the amplifier 121 will indicate any difference between Vfb and Vref. This output is integrated on Cint 122. This will cause the input to the VCO 130 to adjust until the control loop settles.

Figure 2:
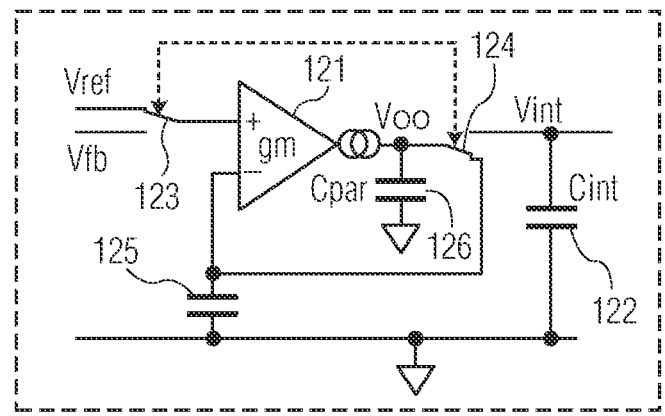
FIG. 2 illustrates that a parasitic capacitance is found at the output of the amplifier.

FIG. 2 illustrates that a parasitic capacitance 126 is found at the output of the amplifier 121. When Vref is not equal to Vint, then the effective gain is reduced due to the parasitic capacitance on Voo. The effective gain is reduced due to the fact that every period charge is needed to change the voltage Voo of the output of the amplifier 121 from Vref to Vint. First, Cpar 126 is quickly charged by Cint 122 due to the charge redistribution between Cint 122 and Cpar 126, and the remaining voltage reduction is removed by the loop introducing an offset at the amplifier input in steady state (Vfb=Vref+Voffset). The offset reduces the frequency accuracy because Vref is not equal to Vfb and therefore not only dependent on R and C anymore.

The frequency inaccuracy due to Cpar 126 may be minimized by making the difference between the values Vref and Vint as small as possible. The difference however is process, voltage, and temperature (PVT) dependent. The embodiments described herein provide a solution to remove the frequency inaccuracy due to Cpar 126 in a robust way over PVT and to improve the auto-zeroing solution.

Figure 3:
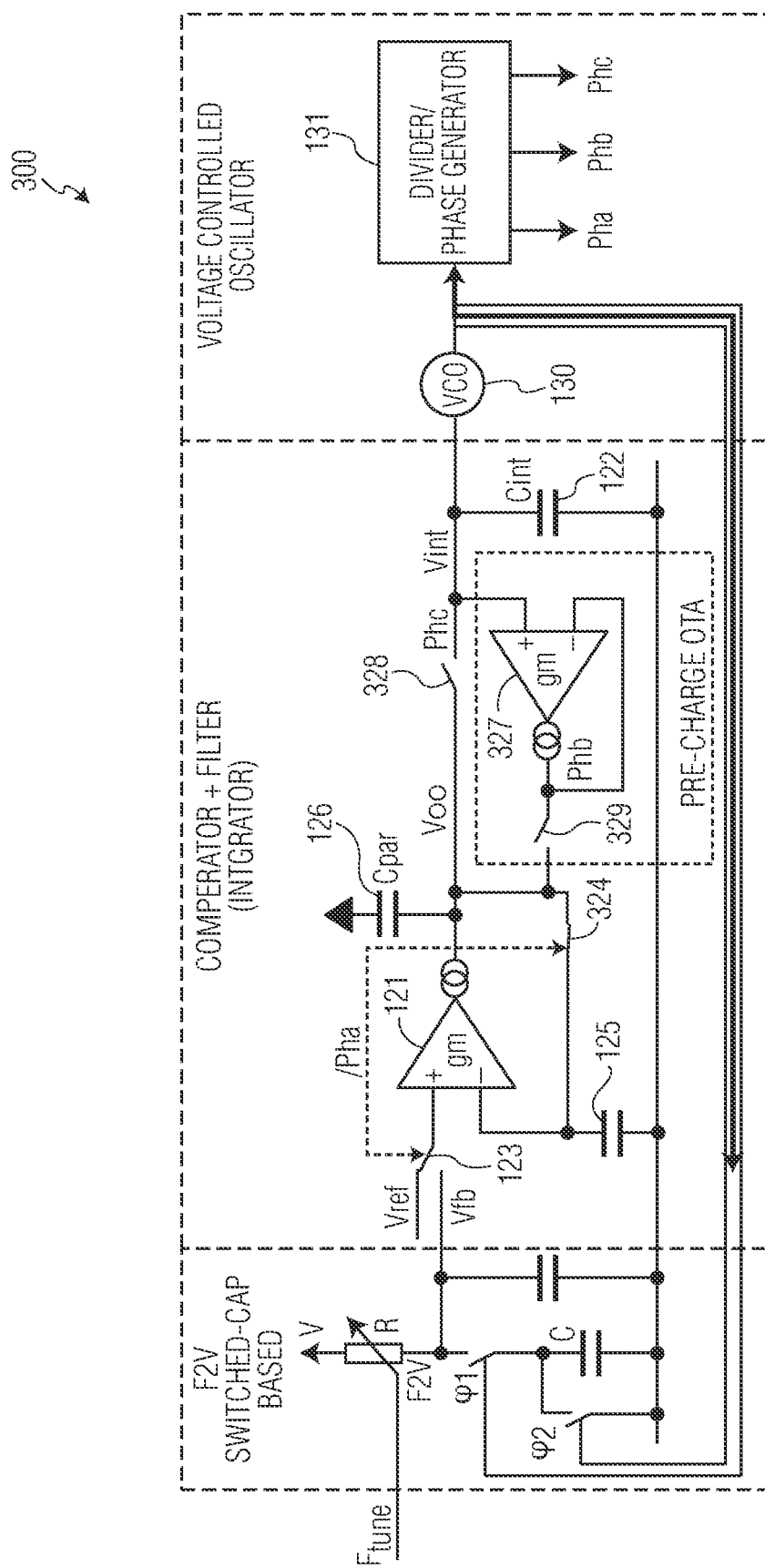
FIG. 3 illustrates an FRO with a pre-charging amplifier to pre-charge the output of the amplifier 121 to Vint.

FIG. 3 illustrates an FRO with a pre-charging amplifier to pre-charge the output of the amplifier 121 to Vint. The FRO 300 uses the same F2V 110 and VCO 130 as the FRO 100 in FIG. 1. The Integrator 320 is similar to the comparator 120 in FIG. 1, with the addition of the pre-charge amplifier 327 and switches 328 and 329. The pre-charge amplifier 327 may be, for example, an OTA or any other appropriate type of amplifier. The pre-charge amplifier 327 pre-charges the parasitic capacitance Cpar 126 to a voltage of Vint. This means that there will be no voltage reduction of Vint due to the need to charge Cpar 126.

A divider/phase generator 131 has been added to the output of the VCO 130. The phase generator 131 generates three control signals Pha, Phb, and Phc. These control signals are used to control the various switches in the comparator 320. Specifically, Pha controls switches 123 and 324, Phb controls switch 329, and Phc controls switch 328.

Figure 4:
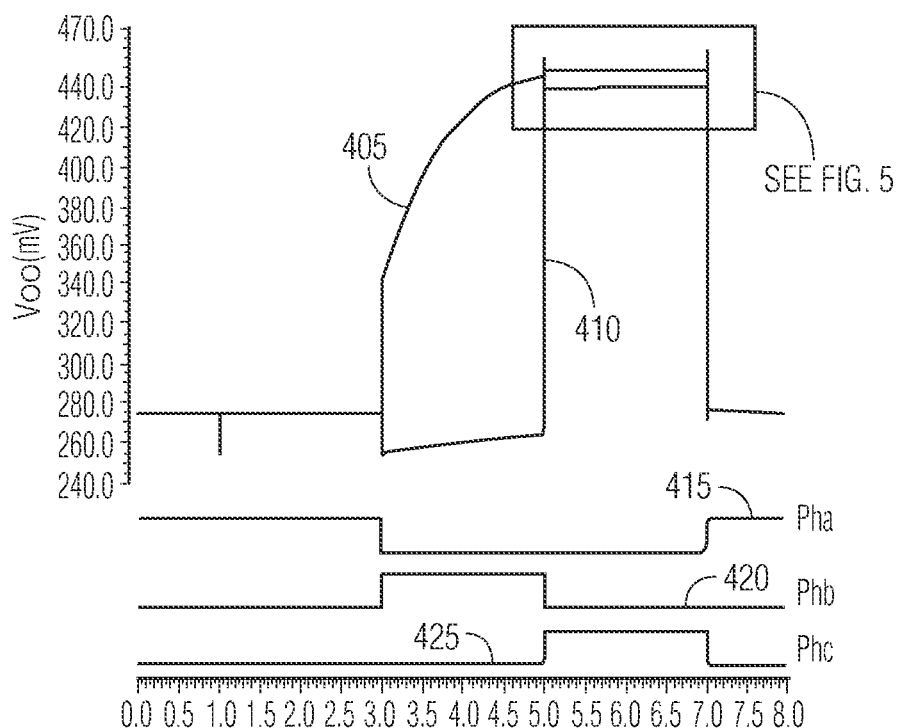
FIG. 4 illustrates the signals used to control the switchers in the comparator and how the comparator works.
Figure 5:
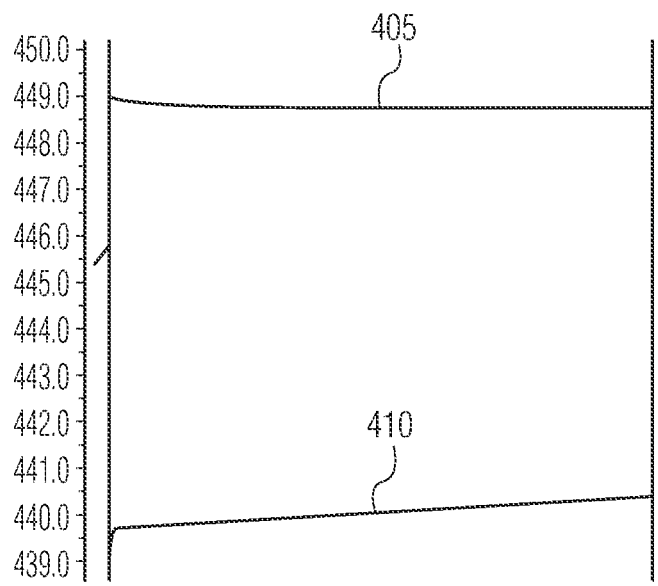
FIG. 5 illustrates a close up plot of the Voo when Phc is high.

FIG. 4 illustrates the signals used to control the switchers in the comparator and how the comparator works. FIG. 4 shows a plot of Voo with pre-charge 405 and Voo without pre-charge 410. Also plots of the controls signals Pha 415, Phb 420, and Phc 425 are shown. Pha controls switches 123 and 324. When Pha 415 is high Vref is sampled and stored on the sampling capacitor 125. When Pha 415 is low Vfb is input into the amplifier 121. When Pha 415 goes low, then Phb 420 goes high to close switch 329. This allows the pre-charge amplifier 327 to charge the parasitic capacitor 126 to be equal to Vint. Once Phb 420 goes low, Phc 425 goes high to close switch 328. This allows the output of the amplifier 121 to be connected to the VCO 130. As the input to the amplifier 121 is Vfb and the sampled Vref, the output of amplifier 121 is based upon the difference in the input voltages that will lead to correction of the frequency of the VCO 130. FIG. 5 illustrates a close up plot of the Voo when Phc 425 is high. As can be seen, the Voo with pre-charge 405 settles quickly to a constant value. The Voo without pre-charge 410 continues to rise during this period.

During operation without pre-charging, Cpar 126 is quickly charged by Cint 122 when Vfb is applied to the amplifier 121. The voltage over Cint 122 however is reduced due to the charge redistribution between Cint 122 and Cpar 126. The voltage reduction is removed by the loop introducing an offset at the amplifier which effects a reduction of the effective gain.

With pre-charging, Cpar 126 is first pre-charged with the pre-charge amplifier 121 to the same voltage as Vint when the control signal Phb 420 goes high and closes switch 329. So, there will be no voltage reduction of Vint due to Cpar 126, hence no offset is introduced at the amplifier 121.

Figure 6:
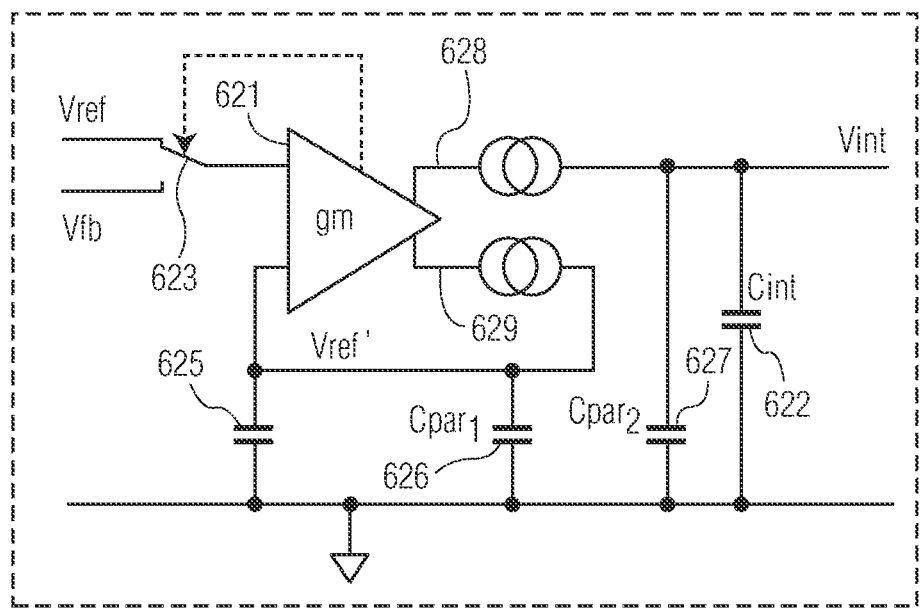
FIG. 6 illustrates another embodiment of a comparator that compensates for parasitic capacitors at the output of the amplifier.

FIG. 6 illustrates another embodiment of a comparator that compensates for parasitic capacitors at the output of the amplifier. The comparator 600 includes an amplifier 621, switch 623, integrating capacitor Cint 622, and sampling capacitor 625. The amplifier 621 includes two separate outputs 628 and 629 and an internal switch that switches between the two outputs. Further, each of the outputs 628 and 629 have their own parasitic capacitance Cpar1 626 and Cpar2 627. The first output 628 is connected to the output of the comparator 600 and Cint 622. The second output 629 is connected to the second input of the amplifier 621 and the sampling capacitor 625. As a result the parasitic capacitances are independent from one another and only effect their respective outputs. As a result the value of Vint is stored on both Cint 622 and Cpar2 627. This is accomplished by switching between the two outputs 628 and 629 of the amplifier 621. In this way the value of both Vref and Vint are preserved during switching. Accordingly, the offset, due to Cpar2 is removed, and therefore the FRO is only dependent on R and C. So, the effective gain of the amplifier is reestablished again.

Figure 7:
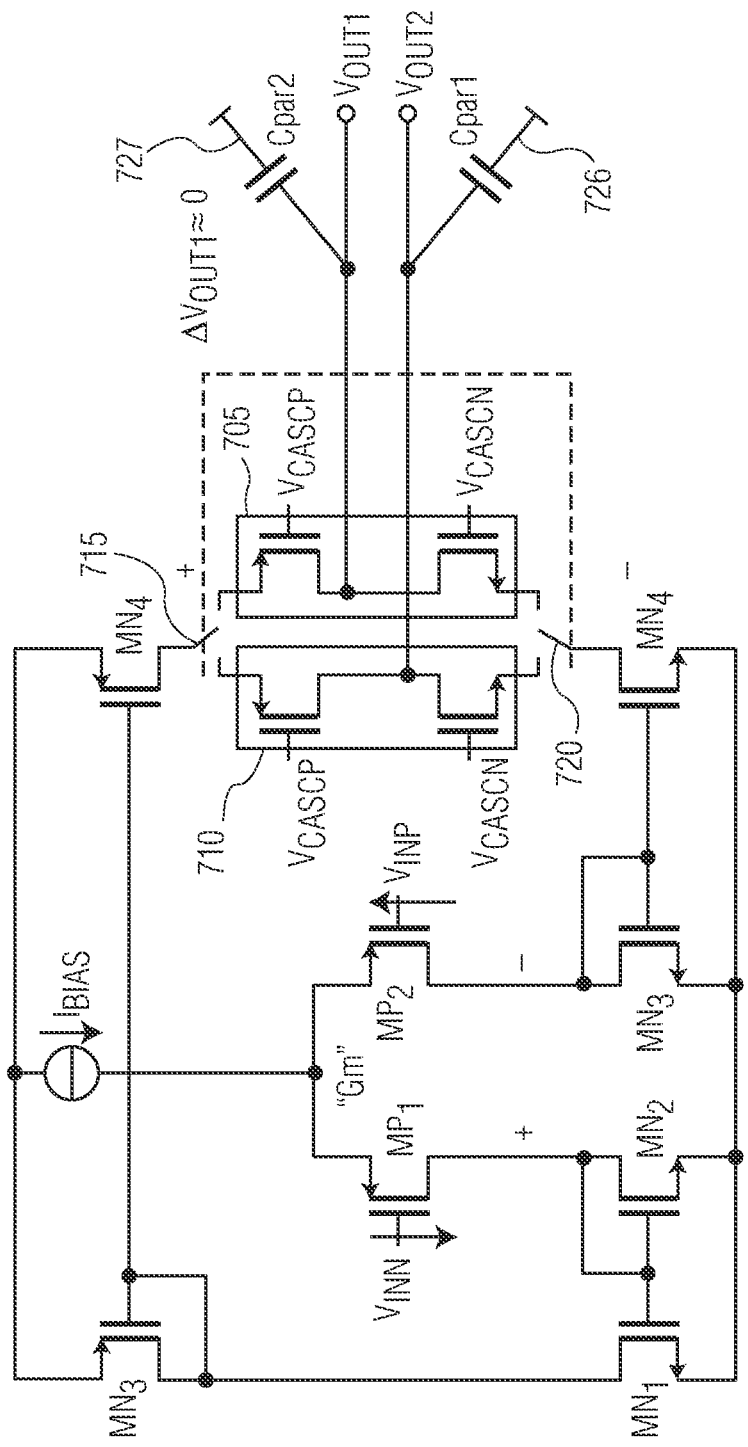
FIG. 7 illustrates a circuit implementation of the amplifier.

FIG. 7 illustrates a circuit implementation of the amplifier 621. The implementation is a standard implementation of the amplifier with two separate output stages 705 and 710. Switches 715 and 720 switch between the two output stages 705 and 710. Parasitic capacitances 727 and 726 are shown as being present at the outputs.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A free running oscillator, comprising:
a voltage-controlled oscillator circuit comprising:
an input configured to receive an input voltage; and
an output configured to provide an oscillation signal, wherein the input voltage controls a frequency of the oscillation signal;
a frequency-to-voltage circuit comprising:
an input configured to receive the oscillation signal; and
an output configured to produce a voltage dependent on a frequency of the oscillation signal;
a comparison circuit comprising:
an amplifier including a first input, a second input, a first output, a second output, and a first switch, wherein the first output of the amplifier and the second output of the amplifier are each determined based upon a difference in voltage between the first input of the amplifier and the second input of the amplifier, the first switch selectively activates one of the first output of the amplifier and the second output of the amplifier, and the second output of the amplifier is connected to the second input of the amplifier;
a second switch with an output connected to the first input of the amplifier, a first input connected to a reference voltage, and a second input connected to the output of frequency-to-voltage circuit, wherein the second switch selectively switches between the first input of the second switch and the second input of the second switch to produce an output signal at the output of the second switch;
a sampling capacitor connected between the second input of the amplifier and a ground; and
an integration capacitor connected between an output of the comparison circuit and the ground.

2. The free running oscillator of claim 1, wherein the voltage-controlled oscillator circuit produces at least one control signal configured to control the first switch and the second switch.

3. The free running oscillator of claim 2, wherein the voltage-controlled oscillator causes the free running oscillator to operate in a selected one of a sampling phase and a comparison phase based on the at least one control signal.

4. The free running oscillator of claim 3, wherein, in the sampling phase, the at least one control signal causes the comparison circuit to sample the reference voltage and store the sampled reference voltage on the sampling capacitor.

5. The free running oscillator of claim 4, wherein, in the comparison phase, the at least one control signal causes the comparison circuit to compare a voltage on the sampling capacitor with the output of the frequency-to-voltage circuit.

6. The free running oscillator of claim 1, wherein the amplifier is an operational amplifier configured to produce an amplifier output signal having a current that is based upon the difference in voltage between the first input of the amplifier and the second input of the amplifier.

7. A method for operating a free running oscillator system, wherein a comparison circuit of the oscillator system is configured to operate in a plurality of phases that occur periodically, comprising:
during a first phase of the plurality of phases, providing a reference voltage to a first input of an amplifier via a first switch, wherein a second input of the amplifier is coupled to a first output of the amplifier and is coupled to a sampling capacitor, wherein a voltage of the first output of the amplifier is provided to the sampling capacitor;
during a second phase of the plurality of phases, providing an output voltage from a frequency-to-voltage circuit to the first input via the first switch, providing the voltage of a second output of the amplifier to a voltage-controlled oscillator circuit for controlling a frequency of an oscillation signal outputted by the voltage-controlled oscillator circuit,
wherein the amplifier produces a first output signal at the first output during a first phase, and
wherein the amplifier produces a second output signal at the second output during a second phase.

8. The method of claim 7, wherein the amplifier is an operational amplifier configured to produce an amplifier output signal having a current that is based upon the difference in voltage between the first input and second input of the amplifier.

9. The method of claim 7, further comprising:
during the first phase, sampling the reference voltage; and
storing the sampled reference voltage on the sampling capacitor.

10. The method of claim 9, further comprising:
during the second phase, comparing the sampled reference voltage stored on the sampling capacitor with the output of the frequency-to-voltage circuit.

11. The method of claim 10, further comprising:
during the second phase, integrating the result of the comparison between the stored reference voltage and the output of the frequency-to-voltage circuit using an integration capacitor.

12. The method of claim 11, wherein the integration capacitor is coupled between an output of a comparison circuit that includes the amplifier and a ground.

13. The method of claim 7, further comprising:
with a voltage-controlled oscillator circuit, producing at least one control signal configured to control at least the first switch.

14. The method of claim 11, further comprising:
controlling at least a second switch to selectively switch between the first phase and the second phase, wherein the second switch is configured to selectively activate one of the first output of the amplifier and the second output of the amplifier.

* * * * *